United States Patent
Webber et al.

(10) Patent No.: US 10,869,416 B2
(45) Date of Patent: Dec. 15, 2020

(54) TERMINAL AND METHOD FOR RETAINING A COMPONENT TO A SURFACE, AND MANUFACTURING METHOD AND APPARATUS

(71) Applicant: HARWIN PLC, Portsmouth (GB)

(72) Inventors: Robert Webber, Portsmouth (GB); Sam Bennett, Portsmouth (GB); Kevin Hunt, Portsmouth (GB); Robert Panter, Portsmouth (GB); Mark Plested, Portsmouth (GB); Andrew Mcquilken, Portsmotuh (GB)

(73) Assignee: HARWIN PLC, Hampshire (GB)

( * ) Notice: Subject to any disclaimer, the term of this patent is extended or adjusted under 35 U.S.C. 154(b) by 0 days.

(21) Appl. No.: 16/587,526

(22) Filed: Sep. 30, 2019

(65) Prior Publication Data
US 2020/0107477 A1 Apr. 2, 2020

(30) Foreign Application Priority Data
Oct. 1, 2018 (GB) .................................. 1815992.1

(51) Int. Cl.
*H05K 9/00* (2006.01)
*H05K 3/34* (2006.01)
(Continued)

(52) U.S. Cl.
CPC ........... *H05K 9/0035* (2013.01); *H05K 3/341* (2013.01); *H05K 7/12* (2013.01); *H05K 7/1405* (2013.01);
(Continued)

(58) Field of Classification Search
USPC ........................................ 361/799, 816, 818
See application file for complete search history.

(56) References Cited

U.S. PATENT DOCUMENTS

| 6,051,781 A | 4/2000 | Bianca et al. ................... 174/35 |
| 7,876,579 B1 | 1/2011 | Tsau .............................. 361/818 |

(Continued)

FOREIGN PATENT DOCUMENTS

| CN | 205546409 U | 8/2016 | ............... H05K 9/00 |
| JP | H0710998 U | 2/1995 | ............... H05K 9/00 |

(Continued)

OTHER PUBLICATIONS

Search Report dated Mar. 4, 2019 in related application No. GB1815992.1.

(Continued)

*Primary Examiner* — Hung S. Bui
(74) *Attorney, Agent, or Firm* — Renner Kenner Greive Bobak Taylor & Weber

(57) ABSTRACT

A clip terminal for fixedly retaining a casing is provided. The terminal may have a connector part, at least one upstanding retention clip having a first height relative to a surface of the connector part, and a shielding part. The shielding part is located on an edge of the connector part and projects upwards relative to a surface of the connector part, and has a second height relative to the surface of the connector part which is greater than the first height. Alternatively, a clip terminal comprises a connector part, at least one upstanding retention clip, and a shielding part wherein the shielding part includes an extension portion at a top end that forms a surface for interaction with a suction instrument. A method of retaining a casing relative to a circuit board is also provided. Forming a clip terminal is provided along with a corresponding apparatus.

31 Claims, 13 Drawing Sheets

(51) Int. Cl.
*H05K 7/12* (2006.01)
*H05K 7/14* (2006.01)

(52) U.S. Cl.
CPC ......... *H05K 7/1417* (2013.01); *H05K 9/0009* (2013.01); *H05K 2201/10371* (2013.01); *H05K 2201/10962* (2013.01)

(56) References Cited

U.S. PATENT DOCUMENTS

| | | | |
|---|---|---|---|
| 8,188,381 B2* | 5/2012 | Chan | H05K 9/0035 174/382 |
| 9,055,666 B2 | 6/2015 | Kim | H05K 9/0035 |
| 9,072,205 B1 | 6/2015 | Kitamura et al. | H05K 3/305 |
| 10,165,672 B2* | 12/2018 | Chang | H05K 1/0216 |
| 2008/0220650 A1* | 9/2008 | Wu | H01R 13/6582 439/607.01 |
| 2013/0148318 A1 | 6/2013 | Kim | 361/759 |

FOREIGN PATENT DOCUMENTS

| | | | | |
|---|---|---|---|---|
| JP | 2000196280 A | 7/2000 | ............... | H05K 9/00 |
| JP | 2013211294 A | 10/2013 | ............... | H05K 9/00 |

OTHER PUBLICATIONS

European Search Report dated Jun. 23, 2020 in related European application No. 19200737.5.

\* cited by examiner

TERMINAL AND METHOD FOR RETAINING A COMPONENT TO A SURFACE, AND MANUFACTURING METHOD AND APPARATUS

FIELD OF INVENTION

The invention relates to removably retaining a component to a surface, in particular, to a terminal and method for the retention of a shield casing on a printed circuit board (PCB), and a manufacturing method and apparatus thereof.

BACKGROUND

In order to shield electronic components on a PCB in electronic devices against Electromagnetic Interference (EMI) or Radio Frequency Interference (RFI), shielding in the form of an electrically conductive shield casing or box is commonly placed on the PCB so as to cover the electronic components to be shielded. EMI or RFI can be caused by external influences, or by other parts of the electronic circuit itself, such as antennas or power supplies.

A method of shielding can be achieved when a closed metal can with a free rim at downwardly extending side pieces is soldered to the PCB along the entire free edge of the metal casing. A critical requirement that must be fulfilled in order to achieve good shielding is that the connection between the shield casing free edges and the PCB is well controlled. If any areas of the free edges are not in contact with the PCB creating an electrical contact, the shielding efficiency can be influenced by the largest gap between the shield casing and the PCB. A disadvantage of directly soldering the shield casing to the PCB is in the difficulty of removing the shield casing once it has been attached. Some arrangements include a soldered casing on the PCB, with a removable cap to make up the shield casing. This arrangement provides the permanent fixture of the shield casing, whilst permitting access to the PCB; however the permitted access is limited by the remaining part of the casing that is not part of the cap.

Soldering is not the only method of mounting a shield casing to a PCB; other methods include the use of shield clips fixed to the PCB, an example of which is shown in FIGS. 1 and 2 which show a clip terminal 500 that can "pinch" the free edges of a typical shield casing 510, the clip terminal applying a force to two opposite faces of a free edge of the shield casing in order to retain its position. Using shield clips provides the advantage of removably securing the shield casing to a PCB 530.

Referring to FIG. 3, shield casings which are also known are typically formed from a single piece of flat conductive material 512, typically metal, which is stamped, cut, or etched with four edge portions 514 bent upwards to a position perpendicular to the main surface to form sidewalls of shield casing 520 structure such as that shown in FIG. 4 (note that the shield casings 510 and 520 have the same functionality but have been assigned different reference numeral because of their different appearance). With such a shield casing, gaps 516 can exist at the corners of the casing between each adjacent sidewall which can reduce the Electromagnetic Compatibility (EMC) performance of the shield casing.

U.S. Pat. No. 9,055,666 B2 relates to clip terminal soldered to and mounted on a circuit board, the terminal including a connection part bent at an angle corresponding to that of a corner of a case and at least a pair of clips connected to each other by the connection part. The connection part and the clips are integrated with each other. The connection part has a width less than or equal to that of a solder pattern of the circuit board on which the clip terminal is soldered. A lower end of the corner of a sidewall of the case is fitted into the clips. In one embodiment, support walls are provided that uprightly protrude along an outer edge. Each support wall may have a height less that of plastic pieces that form the pair of clips.

There remains a need to provide an improved removable retention of a PCB shield casing, whilst maintaining EMC performance.

There is also a need for a clip terminal that is versatile and can be used with one or more existing clip mounting techniques such as automatic pick and placement techniques from tape and reel packaging.

There is also a need to provide an improved manufacturing method and apparatus for such a clip.

SUMMARY OF THE INVENTION

From a first aspect, the present invention provides a clip terminal for fixedly retaining a casing, the terminal being suitable for being mounted on a circuit board, the terminal comprising:
   a connector part having a first outwardly extending portion and a second outwardly extending portion,
   upstanding retention clips for gripping a side wall portion of a casing, wherein the clips are positioned on the first and/or second outwardly extending portions and have a first height relative to a surface of the connector part,
   a shielding part located on an outer edge of the connector part for shielding a portion of the casing, the shielding part projecting upwards relative to the surface of the connector part and having a second height relative to the surface of the connector part, wherein the second height is greater than the first height.

In an embodiment, the first outwardly extending portion is at an angle to the second outwardly extending portion. The angle may be such that the first outwardly extending portion and the second outwardly extending portion form a substantially perpendicular shape corresponding to that of a corner portion of the casing. The shielding part may shield the corner portion of the casing.

In an embodiment, each of the first portion and the second portion comprise a pair of the upstanding clips. The shielding part also acts as a guiding member for the casing in that it enables a casing to be fed in diagonal and then in a downward direction such that the casing is aligned to sit in between the upstanding retention clips that are located on the first and second portion.

In an embodiment, the pair of clips are integral with the connector part and the shielding part is integral with the connector part.

The shielding part may project upwards at an incline and not perpendicular relative to the surface of the connector part, such that the shielding part is bent inwards towards the connector part. Therefore, at least the top part of the shielding part can contact at least part of the casing to be retained by the clip terminal. The angle of the incline is such that the shielding part enables a gap in a corner of a casing to be substantially covered to reduce EMI entering the casing. As an example, the angle could be around 86 degrees relative to the surface of the connector part (which can be considered 94 degrees in the direction of bending) but the invention is not limited to this angle.

In an embodiment, the shielding part comprises a first shielding wall connected to an outer edge of the first outwardly extending portion of the connector part and a second shielding wall connected to the first shielding wall and having a planar surface axially aligned with an outer edge of the second outwardly extending portion of the connector part.

The first shielding wall has an extension portion at a top end of the wall that forms a surface which can be sufficiently interacted with and picked up by a suction instrument of a conventional clip terminal mounting machine. The surface of the extension portion may be substantially parallel to the surface of the connector part.

The second shielding wall has a top end which can be sufficiently gripped and picked up by a gripping instrument of a conventional clip terminal mounting machine.

The pair of upstanding retention clips may comprise a first clip attached to an outer edge of the connector part and a second clip attached to an inner edge of the connector part, wherein at a lower portion of the pair of clips, the first clip and second clips converge towards each other, at an upper portion the first and second clips diverge away from each other, and the first and second clip are closest at a middle portion between the lower and upper portions.

From a second aspect, the present invention provides a clip terminal for fixedly retaining a casing, the terminal being suitable for being mounted on a circuit board, the terminal comprising:

a connector part having a first outwardly extending portion and a second outwardly extending portion, upstanding retention clips for gripping a side wall portion of a casing, wherein the clips are positioned on the first and/or second outwardly extending portions, a shielding part located on an outer edge of the connector part for shielding a portion of the casing, the shielding part projecting upwards relative to the surface of the connector part, the shielding part comprising a first shielding wall connected to an outer edge of the first outwardly extending portion of the connector part and a second shielding wall connected to the first shielding wall, wherein the first shielding wall has an extension portion at a top end of the wall that forms a surface which can be sufficiently interacted with and picked up by a suction instrument for placement on a circuit board.

In an embodiment, the first outwardly extending portion is at an angle to the second outwardly extending portion. The angle may be such that the first outwardly extending portion and the second outwardly extending portion form a substantially perpendicular shape corresponding to that of a corner portion of the casing. The shielding part may shield a corner portion of the casing.

In an embodiment, each of the first portion and the second portion comprise a pair of the upstanding clips. The shielding part also acts as a guiding member for the casing in that it enables a casing to be fed in diagonal and then in a downward direction such that the casing is aligned to sit in between the upstanding retention clips that are located on the first and second portion.

In an embodiment, the pair of clips are integral with the connector part and the shielding part is integral with the connector part.

The shielding part projects upwards at an incline and not perpendicular relative to the surface of the connector part, such that the shielding part is bent inwards towards the connector part. The angle of the incline is such that the shielding part enables a gap in a corner of a casing to be substantially covered to reduce EMI entering the casing. As an example, the angle could be around 86 degrees relative to the surface of the connector part but the invention is not limited to this angle.

The pair of clips can be positioned on the first and/or second outwardly extending portions and have a first height relative to a surface of the connector part, and the shielding part has a second height relative to the surface of the connector part, wherein the second height is greater than the first height.

The pair of upstanding retention clips may comprise a first clip attached to an outer edge of the connector part and a second clip attached to an inner edge of the connector part, wherein at a lower portion of the pair of clips, the first clip and second clips converge towards each other, at an upper portion the first and second clips diverge away from each other, and the first and second clip are closest at a middle portion between the lower and upper portions.

From a third aspect, the present invention provides a method for retaining a casing relative to a circuit board, comprising: providing a circuit board with electrical circuitry; providing at least one of the aforementioned clip terminals in a position proximal to the electrical circuitry on a circuit board; and receiving in the clip terminal a casing to shield the electrical circuitry by positioning the casing so as to abut the clip terminal in order to retain the casing in a position relative to the circuit.

From a fourth aspect, the present invention provides a method for manufacturing a clip terminal such as the clip terminal of the first aspect or second aspect.

From a fifth aspect, the present invention provides a method and apparatus for manufacturing a clip terminal for fixedly retaining a casing, the terminal being suitable for being mounted on a circuit board.

BRIEF DESCRIPTION OF THE DRAWINGS

Embodiments of the present invention are now described, by way of example only, with reference to the accompanying drawings, in which.

DETAILED DESCRIPTION OF EMBODIMENTS

A clip terminal is used to retain a shield casing (also known as a shield can) on a PCB for EMC protection. In some embodiments of the invention, a clip terminal comprises shielding means to reduce a gap that may exist in one or more corners of a shield casing after the casing has been formed, for example, from a piece of stamped material. The clip terminal may also be formed automatically using manufacturing machinery and constructed such that it can be automatically picked and placed from a first location, for example, a tape and reel packaging, to a second location, for example, the PCB where it is to be fixed. In some embodiments, the shielding means to reduce the gap is slightly inclined so that there is contact between at least a portion of the shielding means, for example, the top portion, and the shield casing.

A clip terminal 100 according to a first embodiment of the invention will now be described with reference to FIGS. 4 to 11.

Figure 1:
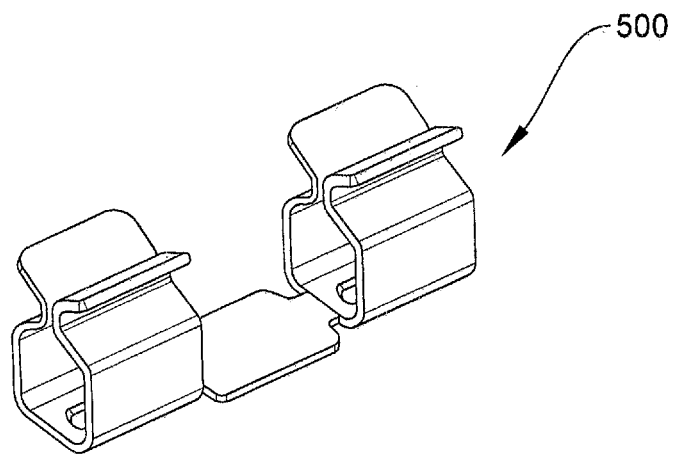
FIG. 1 is a perspective view of a clip terminal arrangement known in the prior art.
Figure 2:
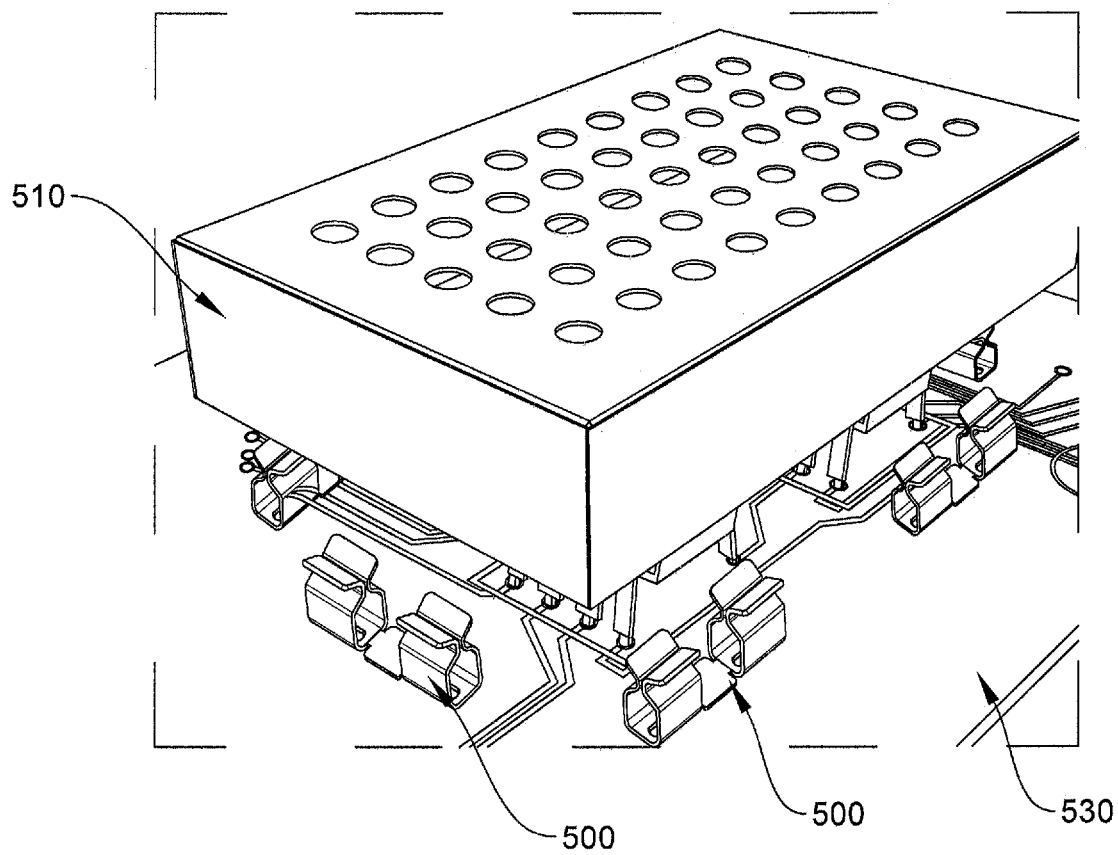
FIG. 2 is a view of a shield casing located above a typical PCB including a plurality of the clips terminals of FIG. 1.
Figure 3:
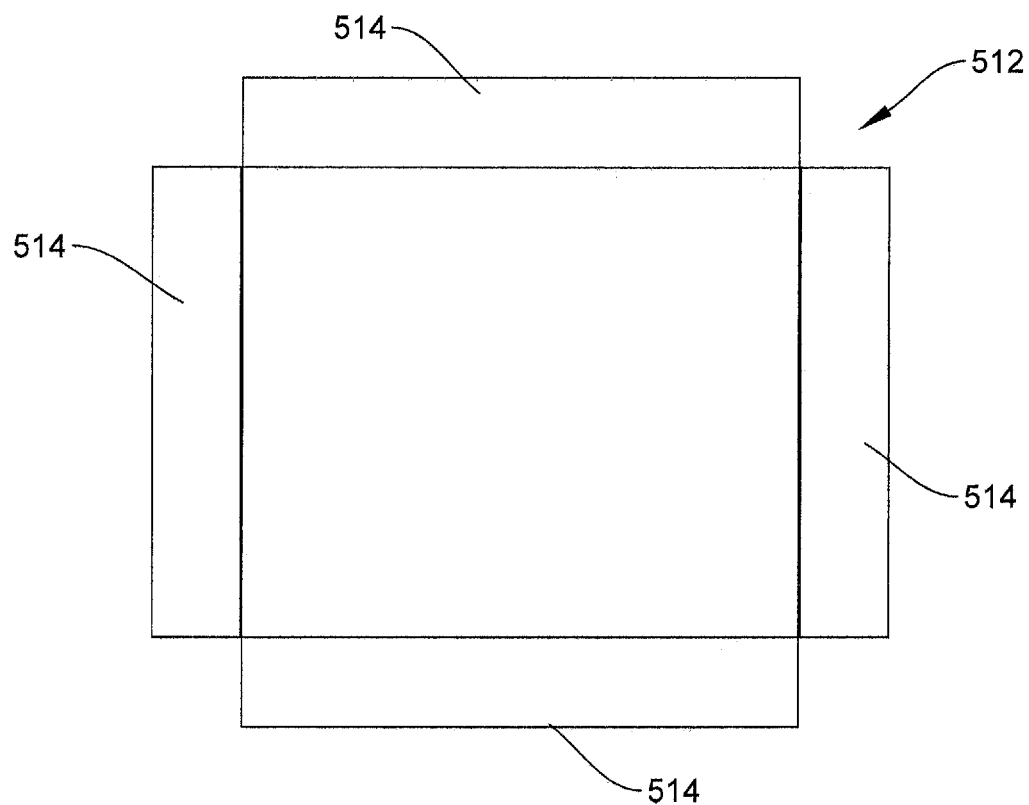
FIG. 3 is a top view of a known shield casing flat material before it is formed into a shielding casing.
Figure 4:
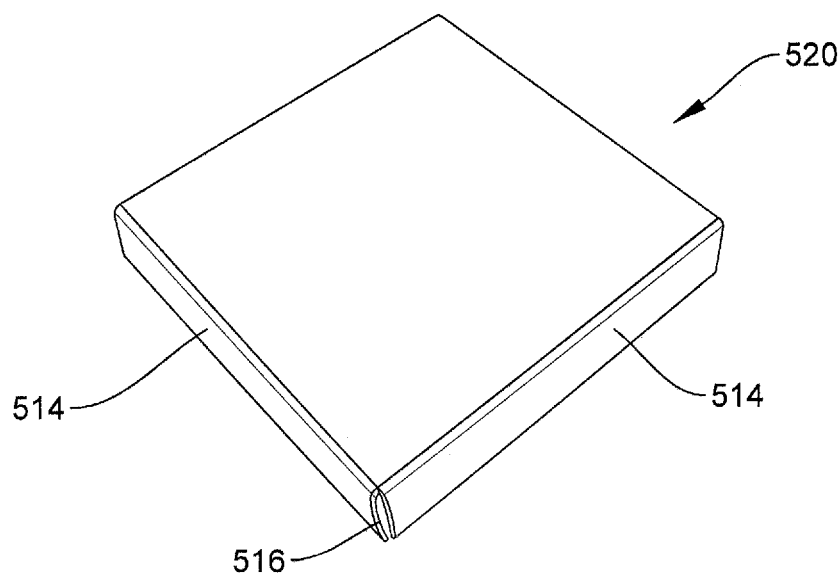
FIG. 4 is a perspective view of a shield casing formed from the shielding casing flat material of FIG. 3.

In the first embodiment, the clip terminal 100 comprises a base connector part 102 having first outwardly extending portion 104 and a second outwardly extending portion 106. In this embodiment, the first outwardly extending portion 104 is at an angle to the second outwardly extending portion. The angle is such that the first outwardly extending portion and the second outwardly extending portion form a substantially perpendicular shape corresponding to that of a corner portion of a typical shield casing 520 such as that shown in FIG. 9. Put another way, the first outwardly extending portion 104 is horizontal and the second outwardly extending portion 106 is vertical thus corresponding to a corner portion of the shield casing 520. The angle is therefore ninety degrees but this could vary depending on the type of shield casing to be used with the clip terminal or where the clip terminal is intended to be placed relative to the casing. In some embodiments (not shown), the angle may be 180 degrees such that the first outwardly extending portion is axially aligned with the second outwardly extending portion more similar to the clip terminal arrangement shown in FIG. 1.

The clip terminal 100 further comprises one or more retention clips to provide a lateral spring force and grip side wall portions 514a, 514b (see FIG. 9) of the shield casing 520. In this embodiment, a first pair 108 and a second pair 110 of retention clips are provided on the clip terminal, however, it will be appreciated to those skilled in the art with the benefit of this disclosure that any number of retention clips can be provided to grip or contact a part of a side wall of the casing 520.

The first pair of retention clips 108 have first and second generally upstanding clip elements 112, 114 that are resilient spring portions connected to the first outwardly extending portion 104 of the connector part 102. The first clip element 112 is connected to an outer edge of the first outwardly extending portion 104. The second clip element 114 is located on an opposite side of first outwardly extending portion 104 and connected to an inner edge of the first outwardly extending portion 104. At a lower portion of the first pair of clips 108, the first clip element 112 and second clip element 114 converge towards each other after an initial divergence adjacent the base of the connector part 102. At an upper portion of the first pair of clips 108, the first clip element 112 and second clip element 114 diverge away from each other, and the first clip element 112 and second clip element 114 are closest at a middle portion between the lower and upper portions. The gripping of the side wall of the shield casing 520 can take place at the middle portion.

Similarly to the first pair of retention clips, the second pair of retention clips 110 have first and second generally upstanding clip elements 116, 118 that are resilient spring portions but are connected to the second outwardly extending portion 106 of the connector part 102. The first clip element 116 is connected to an outer edge of the second outwardly extending portion 106. The second clip element 118 is located on an opposite side of second outwardly extending portion 106 and connected to an inner edge of the second outwardly extending portion 106. At a lower portion of the second pair of clips 110, the first clip element 116 and second clip element 118 converge towards each other after an initial divergence adjacent the base of the connector part 102. At an upper portion of the second pair of clips 110, the first clip element 116 and second clip element 118 diverge away from each other, and the first clip element 116 and second clip element 118 are closest at a middle portion between the lower and upper portions. The gripping of the side wall of the shield casing 520 can take place at the middle portion.

The first and second pair of retention clips 108, 110 are integral with the connection part 102 and may be formed by bending the clips upwards from the same material as the base connector part 102 into the desired shape suitable for gripping.

It will be appreciated that, in other embodiments, other types of gripping means may be provided instead of the specific retention clip arrangement described and may consist of any other form of resilient elements suitable for providing the required lateral spring force.

In order to enable more complete shielding and protection of electrical components contained with the shield casing 520 when positioned in the clip terminal 100, a shielding part 130 is provided on the clip terminal. In this embodiment, the shielding part 130 is located on an outer edge of the connector part for shielding a portion of the casing where there may be a gap in a wall of the casing 520. The shielding part 130 projects generally upwards substantially transversely relative to a planar surface of the base connector part 102. The shielding part 130 is integral with the connector part. It will be appreciated that the shielding part may not be integral although there are advantages to having it integral with the connector (and retention clips) and formed from the same material as the base connector part 102.

The shielding part 130 comprises a first shielding wall 132 connected to an outer edge of the first outwardly extending portion 104 of the connector part 102 and a second shielding wall 134 that is connected to the first shielding wall 132 substantially along one longitudinal edge 132a of the first shielding wall 132 such that the second shielding wall is considered to be bent or folded along the longitudinal edge 132a towards an outer edge of the second outwardly extending portion 106 up to when it is aligned with the outer edge. In this embodiment, the second shielding wall 134 is bent until it forms about a ninety degree angle with the first shielding portion 132. With this construction there may be a small gap 135 between the bottom of the second shielding wall and the outer edge of the second outwardly extending portion 106.

In other embodiments (not shown), the second shielding wall is connected to an outer edge of the second outwardly extending portion of the connector part.

Figure 9:
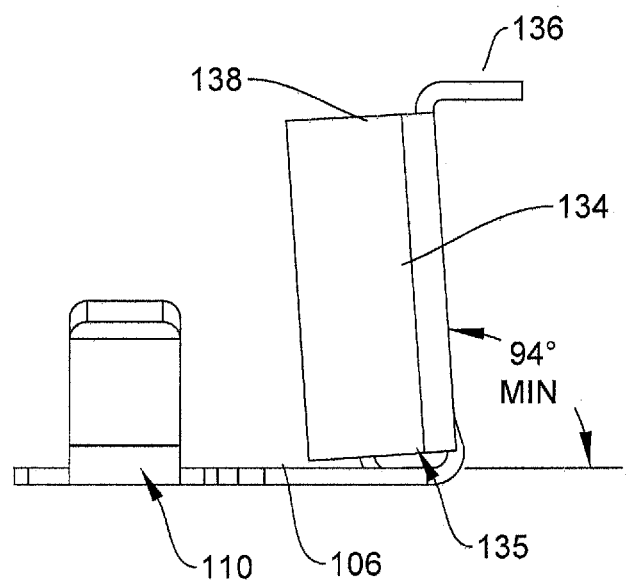
FIG. 9 is a view of the clip terminal of FIG. 5 from a third side.
Figure 10:
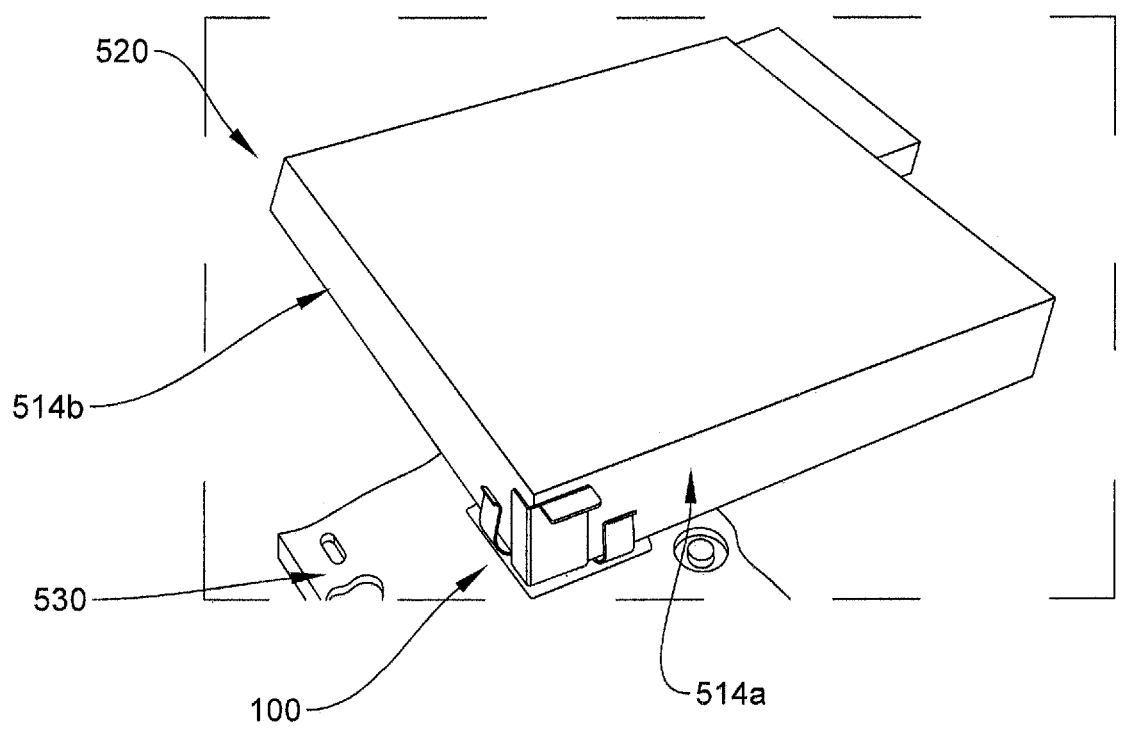
FIG. 10 is a perspective view of a clip terminal of FIG. 5 having received a shield casing such as that of FIG. 4.
Figure 11:
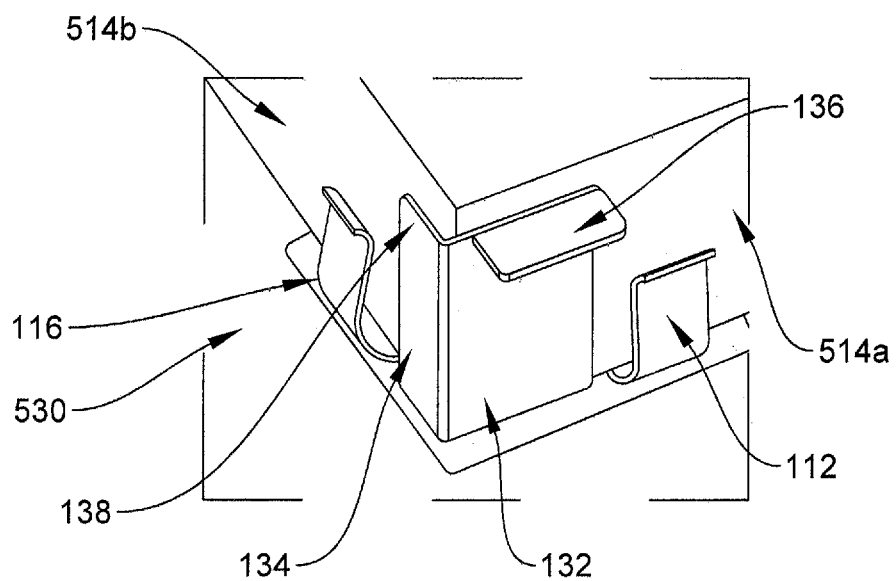
FIG. 11 is a closer view of a clip terminal and part of the shield casing of FIG. 10.

In this embodiment, the shielding part 130 and particularly the first shielding wall 132 projects transversely upwards at an incline and not perpendicular relative to the surface of the connector part, such that the shielding part 130 is bent inwards towards the connector part 102. Therefore, at least the top part of the shielding part 130 can contact at least part of the corner of the shield casing 520 and to provide better shielding and retention. The angle of the incline is such that the shielding part enables a gap in a corner of a casing to be substantially covered to reduce EMI entering the casing. In this embodiment, the angle is acute and around 86 degrees relative to the surface of the connector part 102 however the angle can vary and is not limited to 86 degrees. Looking at the angle relative to the outside of the first shielding wall and the axis of the second outwardly extending portion 106, the angle can be considered to be 94 degrees (as shown in FIG. 9).

The first shielding wall 132 has an extension portion 136 at a top end of the wall 132 that forms a surface which can be sufficiently interacted with and picked up by a suction instrument of a conventional clip terminal mounting machine (not shown). The surface of the extension portion 136 may be substantially parallel to the planar surface of the connector part 102. However, it will be appreciated that such an arrangement is one example and other orientations are possible to provide a surface that enables interaction with a suction instrument.

The second shielding wall has a top end 138 which can be sufficiently gripped and picked up by a gripping instrument of a conventional clip terminal mounting machine and therefore may not have an extension portion.

The clip terminal can therefore be easily and automatically transported from a first location, which can be a tape and reel packaging, to a second location, which can be a PCB where it is to be fixed.

Figure 7:
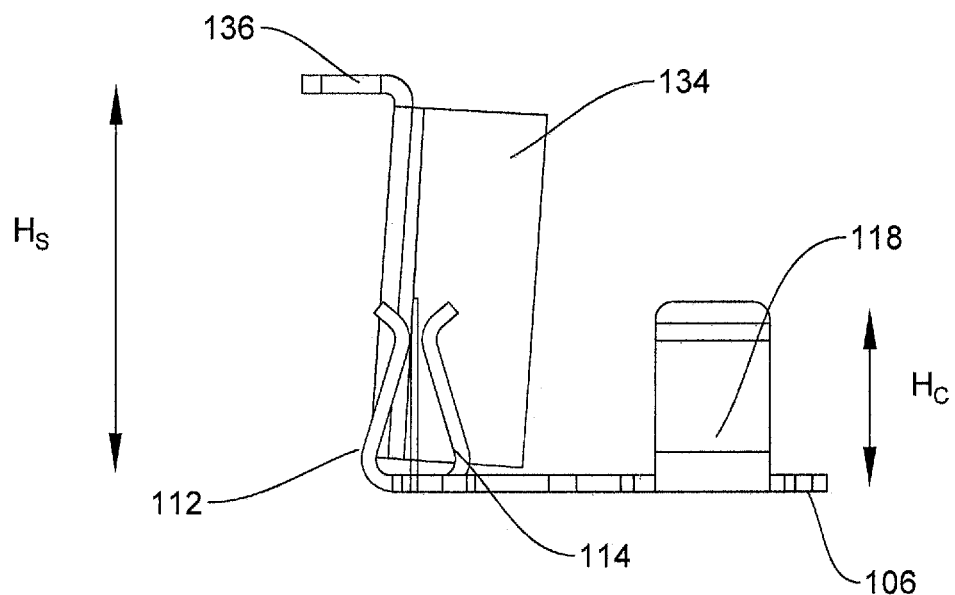
FIG. 7 is a view of the clip terminal of FIG. 5 from a first side.
Figure 8:
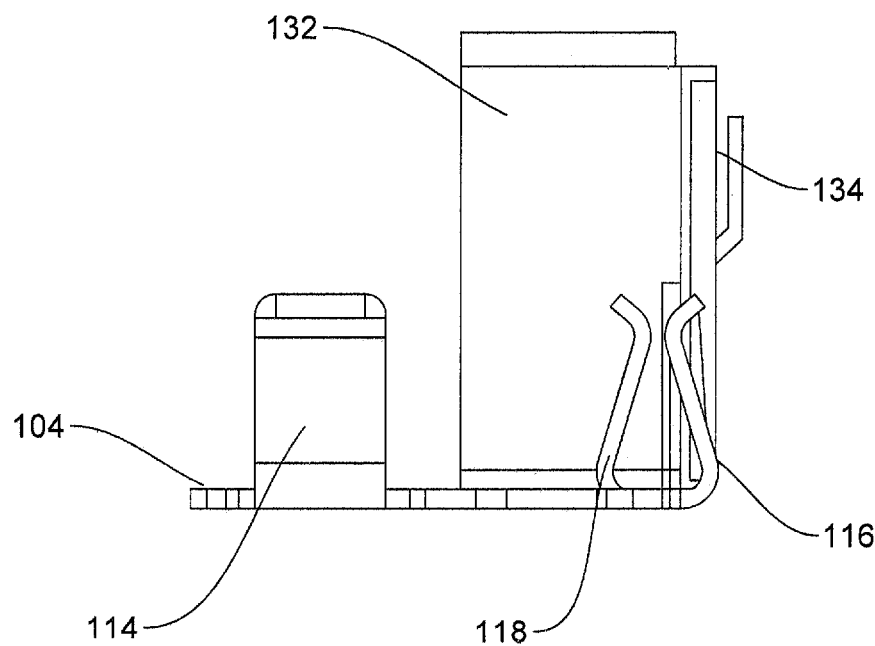
FIG. 8 is a view of the clip terminal of FIG. 5 from a second side.

As shown in more detail in FIG. 7, in this embodiment, the shielding part 130 has a height $H_S$ greater than the heights $H_C$ of the retention clips 108, 110. This can allow easy pick and place of the clip terminal 100 in particular by having a higher point for a pick and place instrument on the top of the shielding part compared to the retention clips which will also be more difficult to pick and place due to their shape. The height of the first shielding wall 132 is preferably the same as the second shielding wall 134, however, in other embodiments they may be different without losing the functionality of providing extra shielding and allowing easy automatic pick and placement.

The shield casing 520 (shown in FIGS. 10 and 11) is known and in this embodiment is a conventional hollow cuboid with at least one open face so as to allow it to shield an electrical circuit on the PCB. It will be appreciated that other shield can geometries may be used with the present embodiment, for instance a hollow cube, a hollow triangular cuboid or a hollow dome shaped component could also be used, each having at least one open face so as to allow it to shield an electrical circuit on the PCB.

The shield casing/can 520 is made from an electrically conductive material so as to protect the shielded circuit from electromagnetic interference (EMI). In particular, the can has the ability to attenuate EMI and will contribute to protecting or shielding the circuit contained within it from receiving electromagnetic waves originating from outside the can (and also attenuate electromagnetic waves originating inside the can from exiting). The shielding part 130 of the clip terminal 100 acts as a guiding member for the casing 520 in that it enables a casing 520 to be fed in diagonal and then in a downward direction such that the casing 520 is aligned to sit in between the upstanding retention clips 108, 110 that are located on the first and second portion 104, 106.

In some embodiments, the shield casing 520 may be retained to a surface such as a PCB surface using the clip terminal 100 provided in this application and shield casing 520 in combination with the clip terminal 100 to be secured to the surface such as the PCB surface may not be a shield against EMI, but a cover to prevent ingress of dust or water.

In a method of retaining the casing 520 relative to the PCB 530, the PCB 530 comprises and is provided with electrical circuitry or some other electronic component (not shown) that requires shielding such as shielding from EMI. At least one clip terminal 100, but preferably a plurality of clip terminals are positioned proximal to the electrical circuitry on the PCB, such that when the casing 520 is received in the terminals 100 the casing will shield the electrical circuitry but in particular the corners of the casing 520 to prevent leakage of EMI. Therefore, the clip terminals 100 are located in a positions that are aligned with corresponding corners (not necessarily all corners) of the casing 520. The casing 520 is received in the clip terminal 100 to shield the electrical circuitry by positioning the casing 520 so as to abut the clip terminal 100 and in particular so as to abut the base of the clip terminal in order for the casing to be retained. The shielding part 130 may abut the corner of the casing 520. The casing 520 can thus be retained relative to the PCB 530 by the clip terminal 100.

Figure 5:
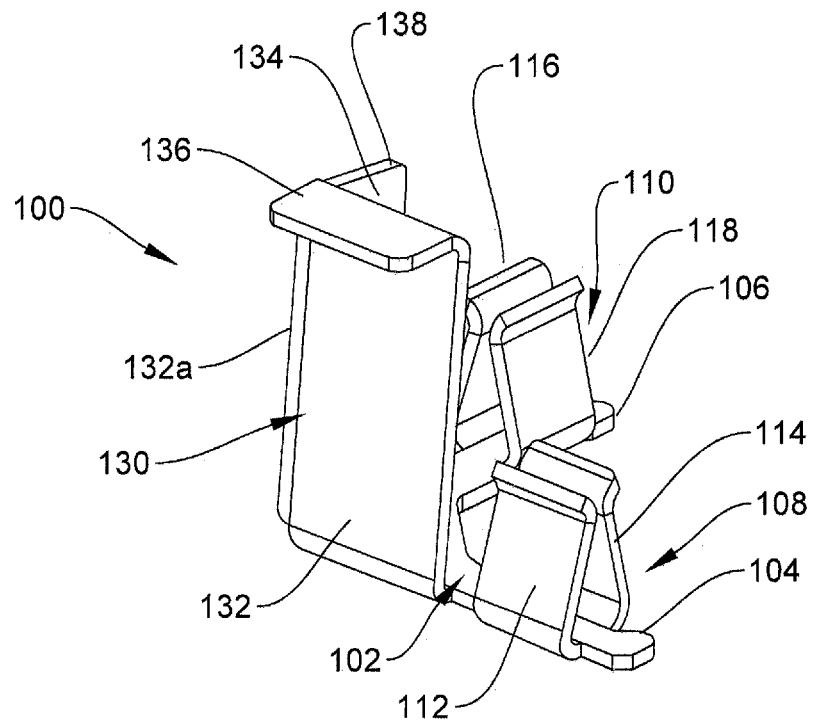
FIG. 5 is a perspective view of a clip terminal arrangement according to a first embodiment of the invention.
Figure 6:
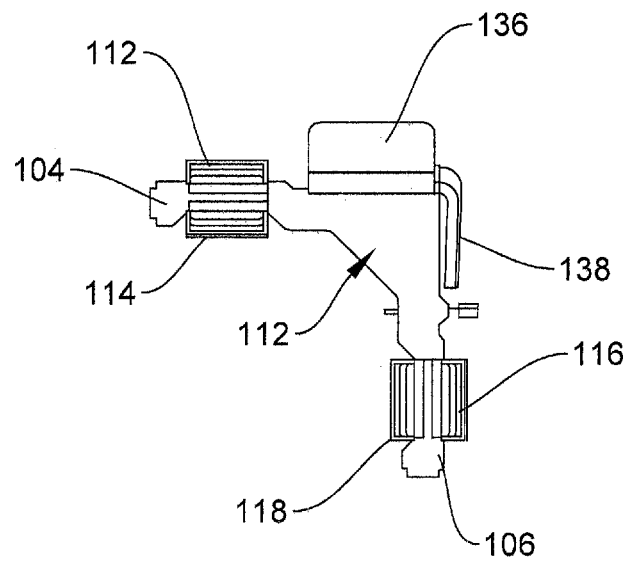
FIG. 6 is a top view of the clip terminal of FIG. 5.

It will be appreciated that the pair of upstanding retention clips on the clip terminal need not take the particular form shown in FIG. 5, and may consist of any other form of resilient elements suitable for providing the required lateral spring force on the internal and external surface of a side wall of a shield casing 520. The distance between the first clip elements and second clip elements of each pair of retention clips may vary, but will be such to allow at least the middle portion of the retention clips to contact the internal and external surface of a side wall of a shield casing 520 and the part of the retention clips to provide a retention force on the shield casing 520. This clips may be designed such that the distance may be adjusted to accommodate different types of shield casings or requirements of the application of the clip terminal 100. For example, the design can be such to allow the retention force to be controlled to provide a high retention force for a permanent retention of the casing 520 or a low retention force for easy removal of the casing 520. With removal retention of a shield casing 520 to a surface such as a printed circuit board, maintenance or fault finding on the surface can be aided given that the shield casing can be removed.

The first clip elements and second clip elements of each pair of retention clips can be made of any material so long as they are not overly flexible (unable to provide a sufficient biasing force) or overly rigid (immoveable through contact with a wall of a shield casing component). Although each clip element used in the pair to secure a component are shown as substantially the same, it will be appreciated by the skilled person that the clip element could have different styles and need not be identical in appearance.

It will also be appreciated that in some embodiments (not shown but derivable from the current figures), only one of the pair of retention clips in combination with the shielding part is provided to retain the shield casing. In one embodiment, only the second clip elements 114, 118 of each pair of clip elements (i.e. the elements that are situated internal to the side wall of the shield casing 520) and a shielding part 130 is provided on a modified clip terminal in order to retain the shield casing 520 (for example, one or more clip elements acting on the same or different vertical side walls of the shield casing 520). The angle of the shielding part 130 relative to the connector part surface may be chosen to ensure contact with the external surface of the side wall of the casing 520 given that the shielding part 130 will be provided the main force for retaining the shield casing from outside the shield casing 520. It will also be appreciated that the distance between the shielding part 130 and the upstanding clips may vary depending on the forces required.

Although an angled clip terminal with substantially a ninety degree corner is described and shown in the figures, it will be appreciated to those skilled in the art with the benefit of the present disclosure that the clip terminal could be constructed to be straight or another shape (not shown) without such an angle in which case the terminal is used with a straight edge of a shied casing rather than a corner. The terminal can thus be modified for use with different types of shield casings.

It will be appreciated that clip terminals in some embodiments may be of a suitable size to be received by a printed circuit board and to receive part of a shield casing/can. In one embodiment, the length of each the first and second outwardly extending portions is around least 5 cm, the height of the shielding part is around 5 cm and the height of the pair of upstanding clips is around 2 cm. These dimensions are provided by way of example only (the invention not being limited to such dimensions) and to demonstrate the scale of some embodiments of the invention.

Embodiments for making a clip terminal from a planar strip material will now be described. It will be appreciated that other methods of manufacturing may be used but the automated methods and apparatus disclosed herein have advantages in manufacturing such a clip terminal as disclosed herein with a complex shape and such advantages would be evident to the skilled person with the benefit of the present disclosure.

Figure 13:
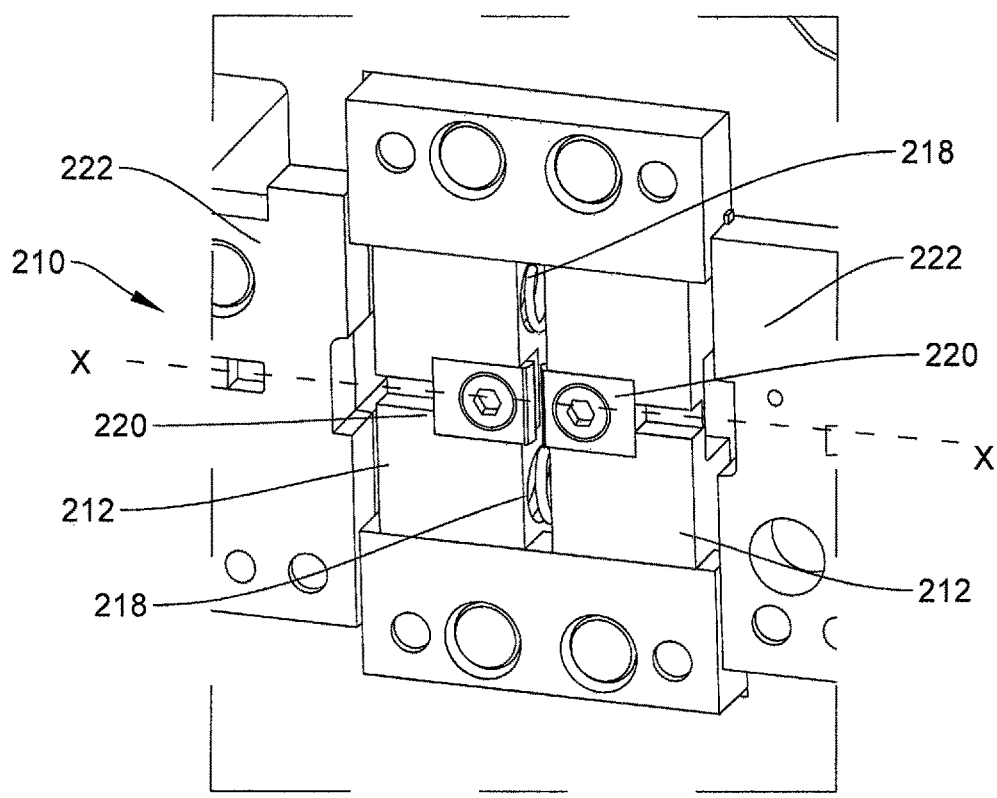
FIG. 13 is a bottom perspective view showing a clip overbend forming section of FIG. 12 in more detail.
Figure 14:
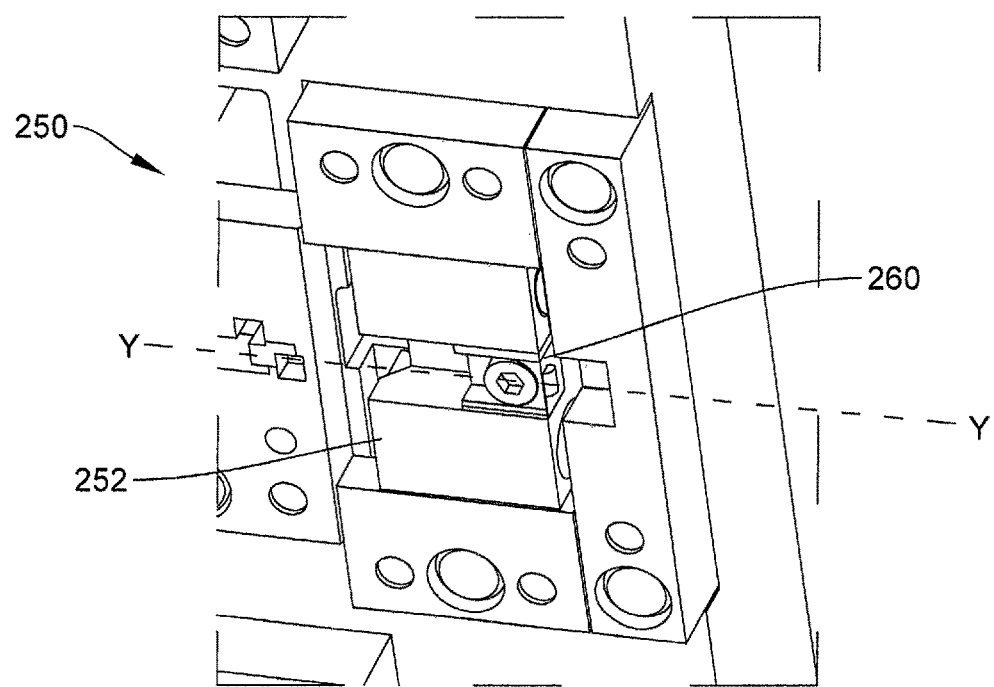
FIG. 14 is a bottom perspective view showing shield overbend forming section of FIG. 12 in more detail.
Figure 15:
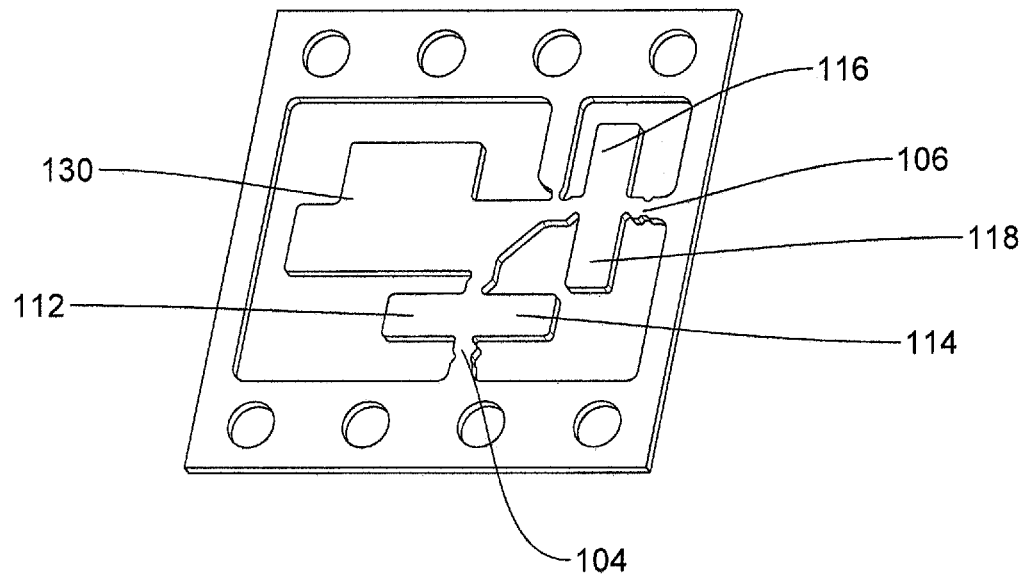
FIG. 15 is shows one embodiment of part of a planar strip material that can be used with the stripper mounted overbend former assembly.

Referring to FIGS. 12 to 18, the clip terminal 100 in one embodiment can be formed using a manufacturing apparatus including a stripper mounted overbend former assembly 200 that receives a strip 300 which is a planar material stamped or punched such that bending of one of more parts of the material will form the clip terminal 100. An example of one portion of the strip 300 used to make one corner clip terminal 100 is shown in FIG. 15; it will be appreciated that the strip 300 is a plurality of these portions arranged adjacent and attached to each other, 'Stripper' refers to the stripper plate section of the assembly and this is also referred to as a pressure plate. 'Overbend' refers to the forming of a part of the planar material past the required angle. The part will then spring back to the required angle. The amount of overbend is determined by the mechanical properties of the material. Both terms will be understood to the skilled person (in the stamping industry). In this embodiment, one method of automatically bending the material is provided. The assembly 200 comprises at least clip overbend forming section 210 and shield overbend forming section 250.

The clip overbend forming section 210 can be a piece of tooling that bends a part of a planar material past 90°. The part of the material is usually formed up to 90° by conventional swipe tooling section before entering the clip overbend forming section and the conventional swipe tooling process will not be described in detail as it will be known those in the art. A discussion of conventional swipe tooling is provided later (see description related to FIGS. 19-21). See FIG. 16 which shows an example of a clip planar material from a larger strip 300 with a part 108a that is formed up to 90°, substantially perpendicular to the surface of the material. Then overbend tooling such as overbend forming section 210 forms it further so as to overbend to a position as shown by clip 108 (see FIG. 5 for example), that is past 90° to the surface of overbend forming section 210 (and an acute angle to the base surface of the clip 108). As will be understood by the skilled person, 'planar material' refers to the flat, raw material that is punched and formed and is a portion of the strip 300. The strip 300 moves in a direction parallel to the longitudinal axis of the assembly 200 (coaxial with the axes X-X and Y-Y shown in FIGS. 13 and 14 respectively).

The clip overbend forming section 210 is attached to a stripper block 200a which itself is attached to a punch block 200b. The clip overbend forming section comprises a plurality of formers 212, preferably two arranged opposite each other along the axis X-X, that when open, will be positioned either side of a clip 108 of clip terminal 100. The formers are movable in directions A and B—that is, in a direction parallel to the longitudinal axis of the assembly 200—and will be driven together by actuators 214 from punch block 200b. The actuators 214 are mounted in the punch block 200b and pass through the stripper block 200a. The actuators 214 are movable in directions C and D—that is, in a direction substantially perpendicular to the longitudinal axis of the assembly 200 and the direction of movement of the strip 300 through the assembly 200. When the actuators 214 retract with the punch block 200b, the formers 212 will open by means of two springs 218 that are in contact with the formers 212. Stripper block 200a will lift taking the formers 212 with it, and this will allow the strip 300 to feed and the next section of the strip 300 that requires overbending to enter the overbend forming section 210. The formers 212 have replaceable inserts 220 which simplify adjustment and servicing. The inserts 220 are the tooling parts, which make contact with the part of the planar clip material of the strip 300 to be overbent and in particular have a surface 220a on one side that is angled such that moving opposing surfaces 220a towards each other will contact the outer surfaces of clip elements 112, 114 and overbend these portions to arrive at the configuration, for example, shown in FIG. 5. It should be noted that the clip 110 that is formed from bending clip elements 116 and 118 can be formed using a conventional swipe tooling and overbend tooling method and will be described later but would be understood by the skilled person and can be incorporated into the assembly 200. For the formation of the bending of clip 110, the central axis of the clip 110 coincides with the axis of movement of the strip through the assembly 200 not requiring the same configuration as the clip overbend section 210 whereas the central axis of the clip 108 is transverse or perpendicular to the axis of movement X of the strip through the assembly 200.

The shield overbend forming section 250 similarly to the clip overbend forming section can be a piece of tooling that bends a part of a planar material past 90°, that is, past 90° to the surface of shield overbend forming section 210 (and an acute angle to the base surface of the shielding part 130) The part of the material is usually formed up to 90° by conventional swipe tooling before entering the shield overbend forming section and the conventional swipe tooling process will not be described in detail as it will be known those in the art but an example is described later. The section 250 comprises a former 252, preferably an inverted U-shaped single block, that when open (i.e. the home position of the overbend tooling assembly before it is driven forward), will be positioned to the rear of the shielding part 130 (rear when following the direction of travel of the strip 300). It will then be driven forward under the extension portion 136 of the clip terminal 100 which is used as a pick and place tab, by an actuator 254 from the punch block 200b. The actuator is movable in direction E—that is, in a direction substantially perpendicular to the longitudinal axis of the assembly 200 and the direction of movement of the strip 300 through the assembly 200. When the actuator 254 retracts with the punch block, the former 252 will open by means of one or more springs, preferably two springs (not shown but housed in former 252 and located either side of insert 260). The stripper block 200a will lift taking the former 252 with it, and this will allow the strip 300 to feed. The former 252 has the replaceable insert 260 which simplifies adjustment and servicing. The inserts 260 are the tooling parts, which make contact with the part of the clip material to be overbent.

Figure 19:
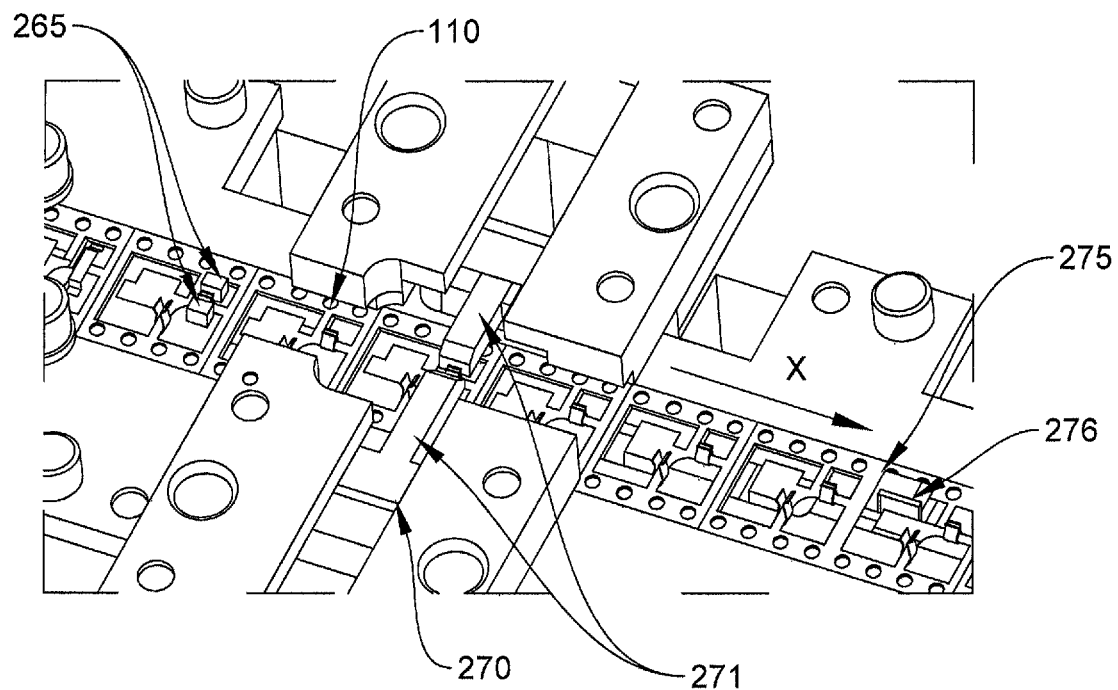
FIG. 19 is a top perspective view showing clip and shield forming process section that is located and can occur after the clip forming of FIG. 17.

As mentioned above, conventional swipe tooling can be used to form the first pair of clips 108a and second pair of clips at 90° upstanding to the surface of the strip material 300. FIG. 19 shows one embodiment of swipe tooling section 265 where a pair of appropriate formers 266 move up from below the strip and interact with the strip to form the second pair of clips upwards to 90°. This can be achieved by pushing the clip elements 116, 118 upwards from a flat position to the 90° position relative to the strip 300 as the strip moves along the direction X. A similar process and machinery although not shown is used for the first pair of clips before the first pair of clips at 90° configuration enter the clip overbend forming section 210. Conventional overbend tooling section 270 with a pair of formers 271 is used to overbend the second pair of clips past 90° by applying a force from sides of the first and second clip elements 116, 118 to form the second pair of clips 110.

Figure 20:
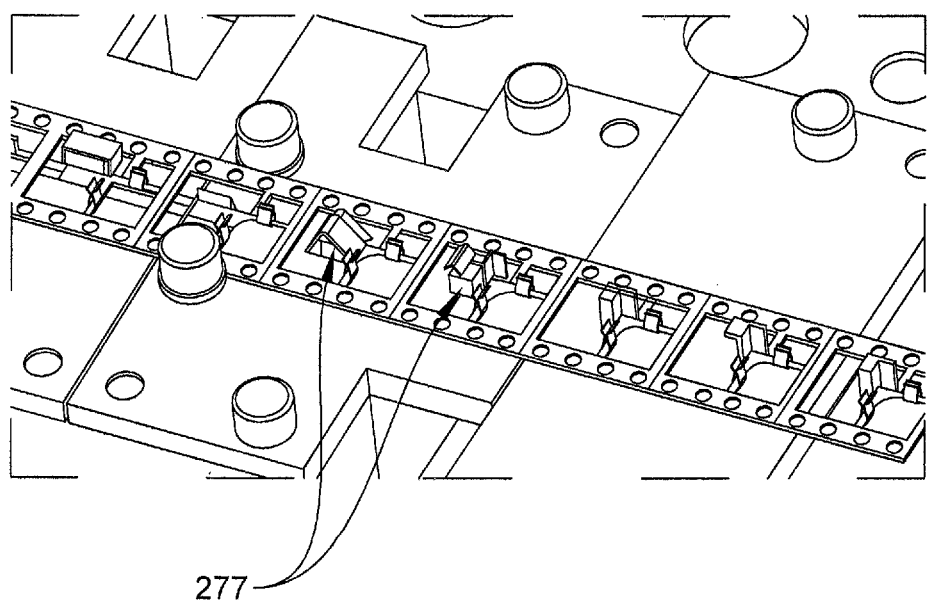
FIG. 20 is a top perspective view showing a continuation of the shield forming section that is located after the clip and initial shield forming process section of FIG. 18.

In addition, the shielding part 130 of the planar strip material is usually formed up to 90° by conventional swipe tooling section 275 before entering the shield overbend forming section 250. An appropriate former 276 in the form of a member that has sufficient strength to move the strip when it interacts with it (for example a solid block but other structures can be appropriate) moves up from below the strip and interacts with the strip to form a bend in the portion of the strip material that corresponds to the second shielding wall 134 inwards towards the first shielding wall 132 (see right side of FIG. 19). As shown in FIG. 20, swipe tooling section 277, employing conventional swipe tooling, includes a first part that is used to bend the portion of the strip material that corresponds first shielding wall 132 upwards to 90°. The swipe tooling section 277 then has a second part adjacent the first part that bends the portion of the strip material that corresponds extension portion 136 outwards to form the lip of the extension portion. It will be appreciated the order of the conventional strip forming and overbend forming can differ and is not limited to the order described in relation to FIGS. 19 and 20.

Figure 21:
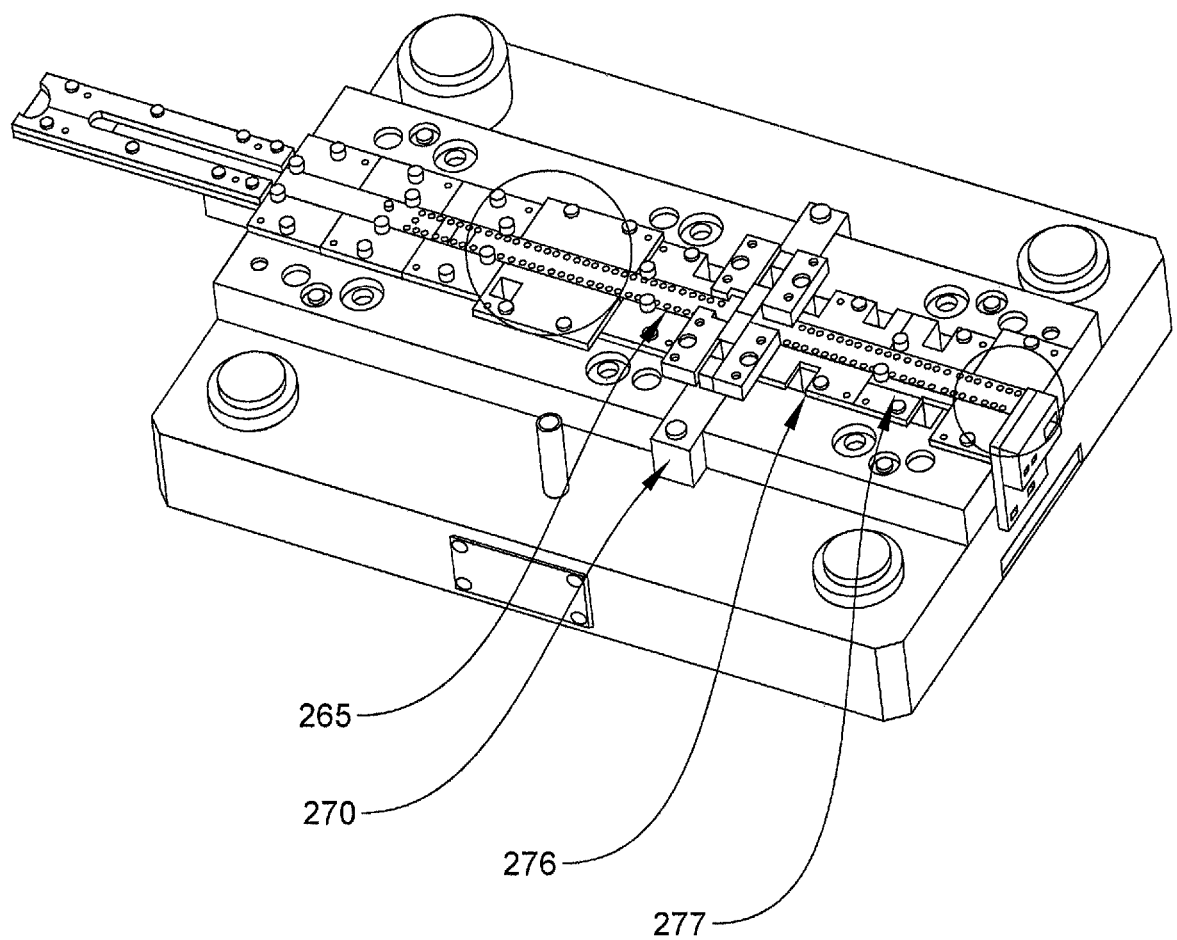
FIG. 21 is a die stamping section of the apparatus that includes the sections of FIGS. 19 and 20 and can be located below the assembly 200 of FIG. 12.

In this embodiment, the swipe tool section 265, overbend tooling section 270 and swipe tool section 275 are positioned after the clip overbend forming section 210 and before the shield overbend forming section 250 in the process path of the manufacturing apparatus. See FIG. 21 to show the embodiment of where the swipe tooling and conventional overbend is located in a die section of the manufacture apparatus. The die section of FIG. 21 is typically a base section for the manufacturing apparatus and is located below the overbend forming assembly 200 shown in FIG. 12. Parts of the overbend forming assembly 200 can interact with the planar strip material from above whilst parts of the die section can interact with the planar strip material from below. For example, the overbend forming assembly can comprise members 216 (see FIG. 12) extending downwards perpendicular to the plane of the directional path of the strip material and that interact with the strip material from above to hold parts of the strip material in place whilst a part of the die section acts on the strip material (for example, when bending is to take place). Other arrangements would be conceivable by the skilled person with the benefit of the present disclosure.

Figure 22:
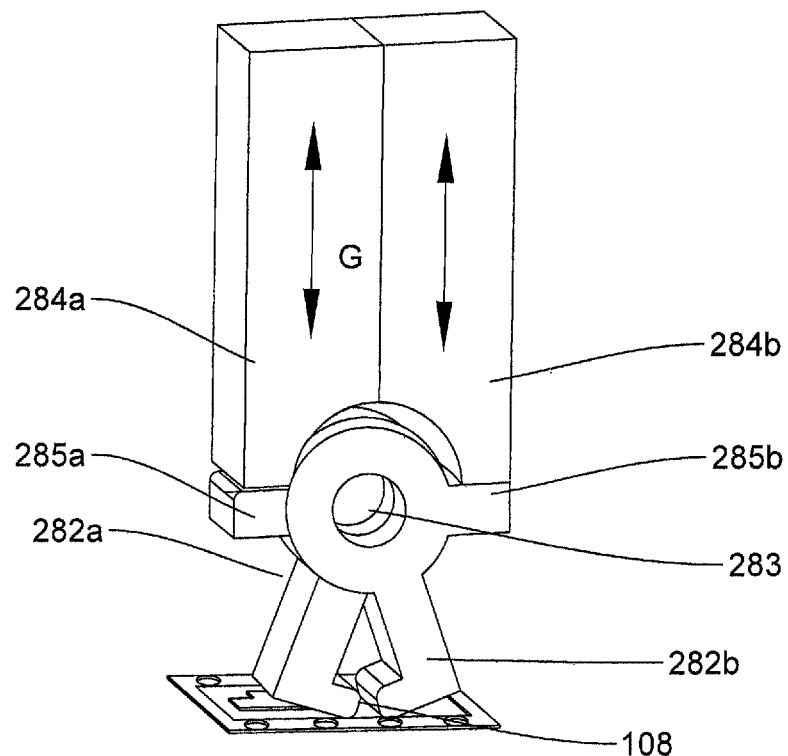
FIG. 22 is a simplified perspective view of a clip overbend former and actuator that can be used in the assembly of FIG. 12 as an alternative to the former and actuator described and shown in relation to FIGS. 13 and 17.

In an alternative arrangement, alternative stripper mounted farmers and actuators to those shown in FIGS. 12-14, and 17-18 may be provided in the assembly 200, as shown in FIGS. 21 and 22.

Figure 12:
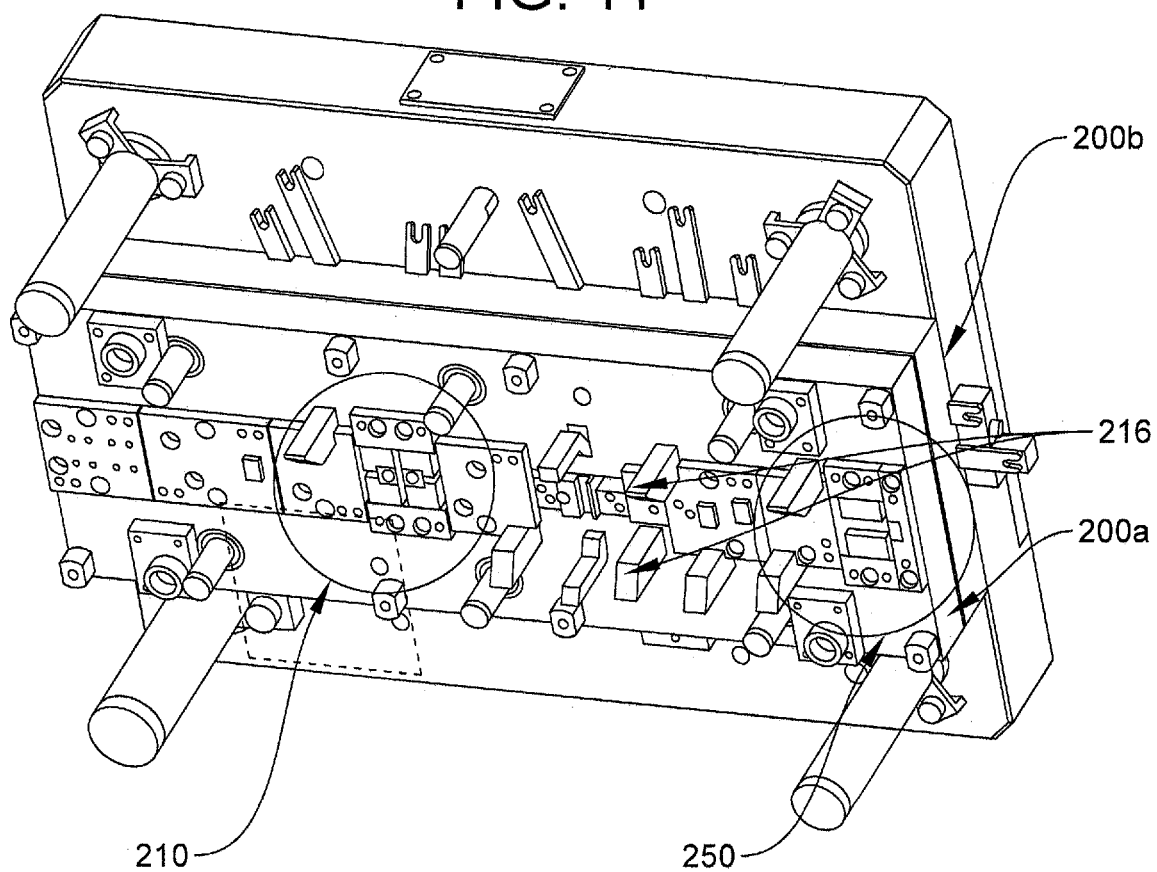
FIG. 12 is a bottom perspective view of a stripper mounted overbend former assembly that can be used in one embodiment to make a clip terminal of the first embodiment from a strip of planar stamped material.

Referring to FIG. 22, in this modification, two overbend formers 282a, 282b would be mounted to the stripper block 200a of FIG. 12 for example instead of formers 212 (see FIG. 12-13) and are pivotable and rotational about a pivot hole or axis 283 through the formers 282a, 282b which may include an axle (not shown) or other fixed rod member that passes through both former 282a, 282b. The formers 282a, 282b are pivotable around the axle when a force is applied to the formers 282a, 282b from above through respective actuators 284a, 284b or some other members that are attached to the punch block 200b and move down in a direction G (that is, perpendicular to the direction of movement of the strip 300) with the punch block 200b. The actuators 284a, 284b interact with respective extension portion 285a, 285b of the farmers 282a, 282b which cause rotational motion of the formers about the axle. The formers 282a, 282b also have foot portions which contact the outer surfaces of clip elements 112, 114 that are in a 90° configuration and overbend these portions to arrive at the configuration, for example, shown in FIG. 5 When the actuators 284a, 284b retract, a spring (not shown) that is located on the underside of the former would rotate the former away from the clip 108 and this will allow the strip 300 to feed. As will be apparent to the skilled person with the benefit of the present disclosure, this modification uses rotational movement of the formers rather than lateral movement which is used in the embodiment in FIGS. 13 and 17.

Figure 23:
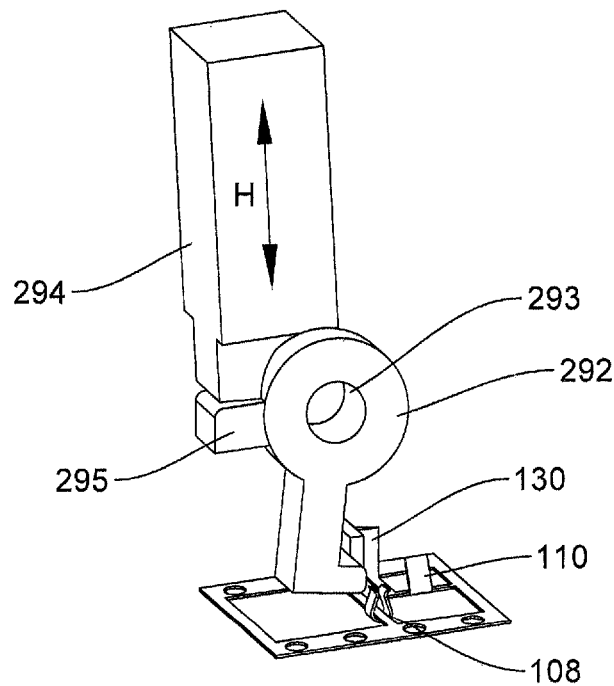
FIG. 23 is a simplified perspective view of a shield overbend former and actuator that can be used in the assembly of FIG. 12 as an alternative to the former and actuator described and shown in relation to FIGS. 14 and 18.

Referring to FIG. 23, in this modification, a rotatable overbend former 292 would be mounted to the stripper block 200a in the shield overbend forming section 250 instead of formers 252 (see FIGS. 12 and 14) and would work in a similar way to the formers described in relation to FIG. 20. The former 292 is pivotable about a pivot hole 293 through the former 292 which may include an axle (not shown) or other fixed rod member that passes through both former 292. The former 292 is pivotable around the axle when a force is applied to it from above through an actuator 294 or some other member that is attached to the punch block 200b and move down in a direction H (that is, perpendicular to the direction of movement of the strip 300) with the punch block 200b. The actuator 294 interacts with extension portion 295 of the formers 292 which causes rotational motion of the former about the axle. The formers 292 also has foot portions which contact the outer surface of shielding portion 130 that is in a 90° configuration and overbend this portion to arrive at the configuration, for example, shown in FIG. 5. When the actuator 294 retracts, a spring (not shown) that is located on the underside of the former would rotate the former away from the shielding part 130 and this will allow the strip 300 to feed. As will be apparent to the skilled person with the benefit of the present disclosure, this modification uses rotational movement of the formers rather than lateral movement which is used in the embodiment in FIGS. 14 and 18.

Figure 24:
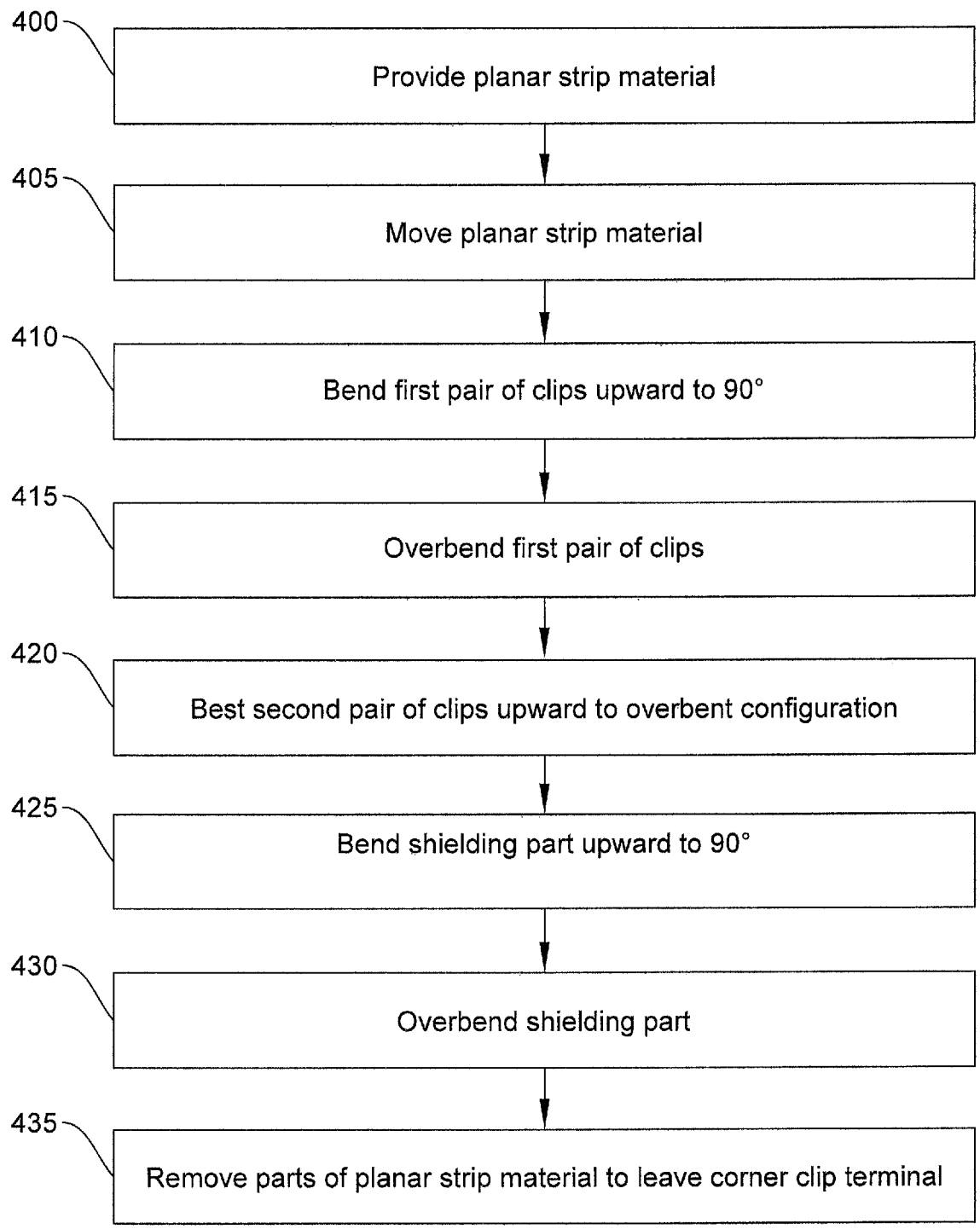
FIG. 24 is a flow diagram of the process of manufacturing using the apparatus of FIGS. 12 and 21.

An example of a method of making the clip terminal 100 using the manufacturing apparatus that may comprise the overbend section shown in FIG. 12 and the die section shown in FIG. 21 is now described with reference to FIG. 24. As will be apparent, the overbend section can be positioned on top of the die section which can form a base for the overbend section of FIG. 12. Reference will also be made to the features of the clip terminal 100 shown in FIGS. 5-6, where appropriate, for ease of explanation.

In step 400, a planar strip 300 is provided which is a single planar material having at least one portion such as that shown in FIG. 15 that forms a corner clip terminal 100. The planar strip is created with stamped and/or punched sections that are to be bent and/or cut during the manufacturing process accordingly to form the clip terminal 100.

In step 405, the planar strip can be moved along a pathway of the manufacturing apparatus which includes the assembly 200 that comprises at least the clip overbend forming section 210 and the shield overbend forming section 250. The pathway is generally parallel to the longitudinal axis of the second outwardly extending part 106 of the planar material that forms the clip terminal 100 (or from another reference point, generally parallel to the central axis of the second pair of clips 110) and generally perpendicular to the longitudinal axis of the first outwardly extending part 104 of the planar material that forms the clip terminal 100 (or from another reference point, generally perpendicular to the central axis of the first pair of clips 108).

Figure 16:
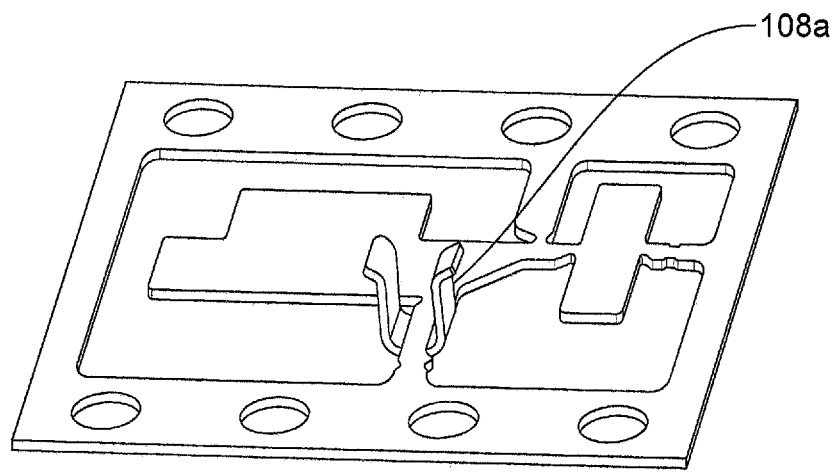
FIG. 16 is the material of FIG. 15 including a feature of the material prior to overbend.

In step 410, the first pair of clips on the first outwardly extending part 104 are bent upwards towards each other to be substantially formed to 90° to the surface of the first outwardly extending part of the strip material in an upstanding configuration 108a (see FIG. 16).

Figure 17:
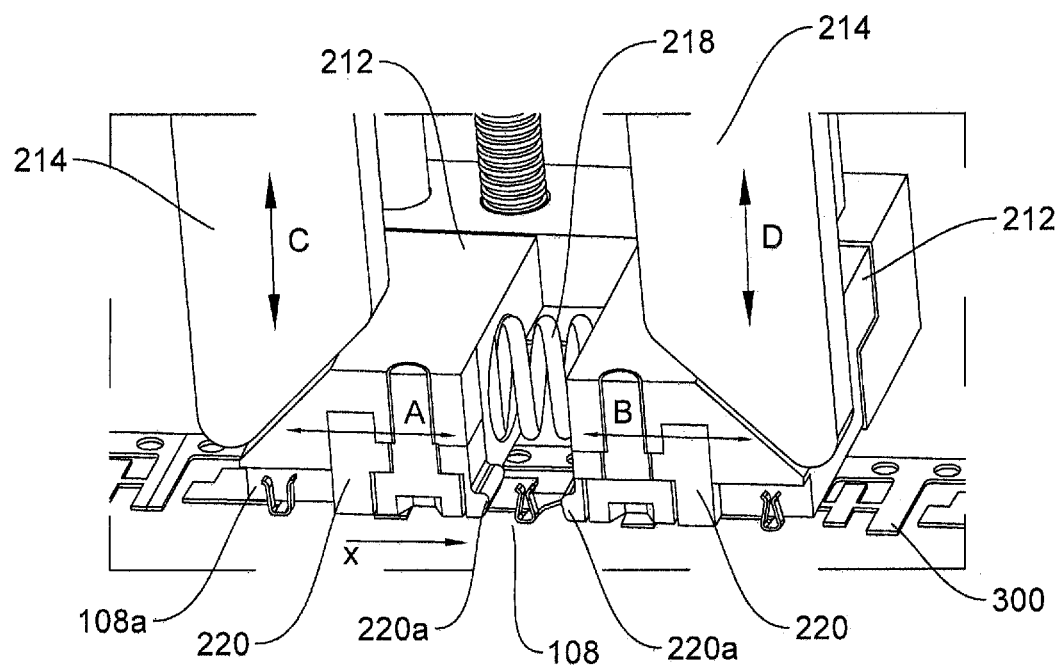
FIG. 17 is a simplified perspective cross sectional view of the clip overbend forming section of FIG. 13 taken along the line X-X of FIG. 13, the formers being used to interact with a strip of planar stamped material to form a pair of the upstanding clips of the clip terminal, the stripper block of FIG. 12 being omitted for clarity.

In step 415, the first pair of clips formed in step 410 move to the clip overbend forming section 210 to be overbent as described in one example in relation to apparatus in FIGS. 13 and 17.

Figure 18:
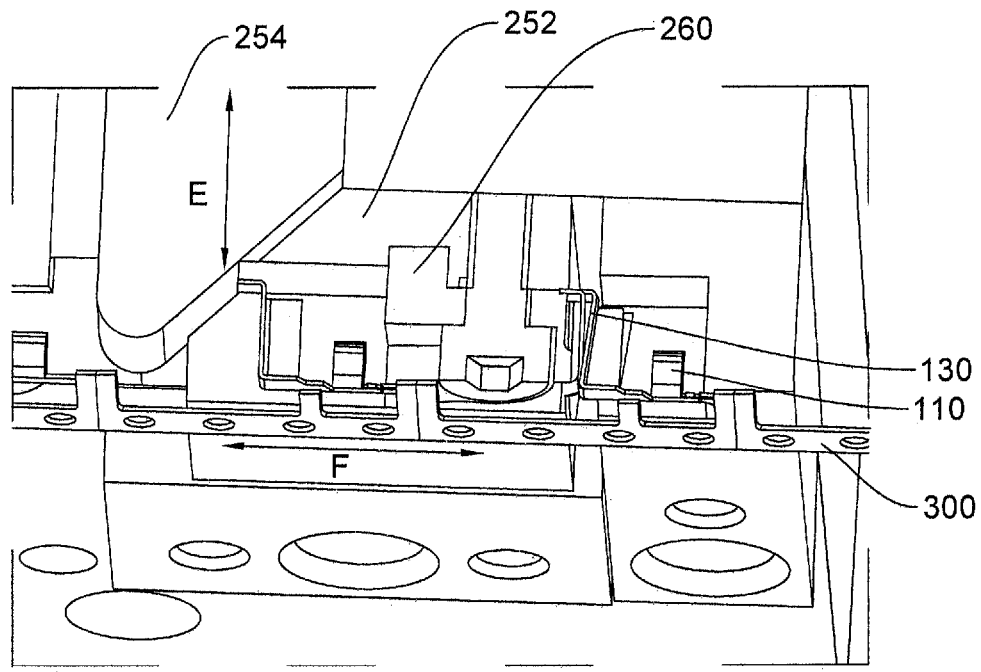
FIG. 18 is a simplified perspective view of the shield overbend forming section of FIG. 14 taken along the line Y-Y of FIG. 14, the formers being used to interact with the strip of planar stamped material to a shielding part of the clip terminal.

In step 420, the strip portion with the overbent first pair of clips 108 moves to a section such as a conventional swipe tooling section (see FIG. 19) that bends upwards at substantially 90° to the surface the second pair of clips 110 and then overbends to an overbent configuration to a similar extent to the first pair of clips 108 (also see FIG. 18 showing that the second pair of clips are already formed).

In step 425, the portion of the strip material including the formed first pair of clips 108 and second pair of clips 110 moves to a section where the portions of the strip material that correspond to the shielding part 130 are formed into shape to 90° to the surface of the strip material. This can be achieved in a conventional way by bending the portion of the strip material that corresponds second shielding wall 134 inwards towards the first shielding wall 132, bending the portion of the strip material that corresponds first shielding wall 132 upwards, and bending the portion of the strip material that corresponds extension portion 136 outwards to form the lip on the first shielding wall 132. The shielding part in this configuration is at up to 90° to the surface of the strip material. An example of the process is shown in FIGS. 19 and 20 described above.

In step 430, the portion of strip material formed in step 425 moves to the shield overbend forming section 210 to overbend the shielding part 130 as described in one example in relation to apparatus in FIGS. 14 and 18.

The upstanding portions are now formed and the remaining parts of the planar strip of material not required can be removed in step 435 to leave the clip terminal 100.

Numerous modifications, adaptations and variations to the embodiments described herein will become apparent to a person skilled in the art having the benefit of the present disclosure, and such modifications, adaptations and variations that result in additional embodiments of the present invention are also within the scope of the accompanying claims.

The invention claimed is:

1. A clip terminal for fixedly retaining a casing, the terminal being suitable for being mounted on a circuit board, the terminal comprising:
   a connector part having a first outwardly extending portion and a second outwardly extending portion; wherein the first outwardly extending portion is at an angle to the second outwardly extending portion;
   at least one upstanding retention clip adapted for gripping a side wall portion of the casing which has a gap between adjacent sidewall portions, wherein the clip is positioned on the first or second outwardly extending portions and has a first height relative to a surface of the connector part; and
   a shielding part located on an outer edge of the connector part for shielding a portion of the casing, the shielding part projecting upwards relative to the surface of the connector part and having a second height relative to the surface of the connector part, wherein the second height is greater than the first height;
   wherein the shielding part projects upwards at an incline relative to the surface of the connector part, such that the shielding part is bent inwards towards the connector part, and the angle of the incline is such that the gap in the casing is substantially covered to reduce EMI entering the casing, or dust or water entering the casing.

2. The clip terminal of claim 1, wherein the angle is such that the first outwardly extending portion and the second outwardly extending portion form a substantially perpendicular shape corresponding to that of a corner portion of the casing, and the shielding part is configured to shield the corner portion of the casing.

3. The clip terminal of claim 1, wherein there are at least two upstanding retention clips, at least one positioned on the first outwardly extending portion and at least another positioned on the second outwardly extending portion.

4. The clip terminal of claim 1, wherein there is at least a pair of upstanding retention clips positioned on the first or second outwardly extending portions.

5. The clip terminal of claim 4, wherein each of the first outwardly extending portion and the second outwardly extending portion comprise the pair of the upstanding clips.

6. The clip terminal of claim 4, wherein the pair of upstanding retention clips comprise a first clip attached to an outer edge of the connector part and a second clip attached to an inner edge of the connector part, wherein at a lower portion of the pair of clips, the first clip and second clips converge towards each other, at an upper portion the first and second clips diverge away from each other, and the first and second clip are closest at a middle portion between the lower and upper portions.

7. The clip terminal of claim 1, where the retention clip or the pair of upstanding clips is/are integral with the connector part.

8. The clip terminal of claim 1, wherein the shielding part is integral with the connector part.

9. The clip terminal of claim 1, wherein at least the top part of the shielding part is arranged to contact at least part of the casing to be retained by the clip terminal.

10. The clip terminal of claim 1, wherein the shielding part comprises a first shielding wall connected to an outer edge of the first outwardly extending portion of the connector part and a second shielding wall connected to the first shielding wall.

11. The clip terminal of claim 10, wherein the second shielding wall has a planar surface axially aligned with at least a part of an outer edge of the second outwardly extending portion of the connector part.

12. The clip terminal of claim 1, wherein the shielding part comprises an extension portion at a top end that forms a surface which can be sufficiently interacted with and picked up by a suction instrument and/or the shielding part has a top end which can be sufficiently gripped and picked up by a gripping instrument.

13. The clip terminal of claim 12, wherein the shielding part comprises a first shielding wall connected to an outer edge of the first outwardly extending portion of the connector part and a second shielding wall connected to the first shielding wall, and wherein the extension portion is at a top end of the first shielding wall.

14. The clip terminal of claim 12, wherein the surface of the extension portion is substantially parallel to the surface of the connector part.

15. The clip terminal of claim 12, wherein the shielding part comprises a first shielding wall connected to an outer edge of the first outwardly extending portion of the connector part and a second shielding wall connected to the first shielding wall, wherein the second shielding wall has a planar surface axially aligned with at least a part of an outer edge of the second outwardly extending portion of the connector part, and wherein the second shielding wall has the top end which can be sufficiently gripped and picked up by a gripping instrument.

16. A method for retaining a casing relative to a circuit board, comprising:
    providing a circuit board with electrical circuitry;
    providing at least one clip terminal of any preceding claim 1 in a position proximal to the electrical circuitry on the circuit board; and
    receiving in the clip terminal a casing to shield the electrical circuitry by positioning the casing so as to abut the clip terminal in order to retain the casing in a position relative to the circuit.

17. A clip terminal for fixedly retaining a casing, the terminal being suitable for being mounted on a circuit board, the terminal comprising:
    a connector part having a first outwardly extending portion and a second outwardly extending portion; wherein the first outwardly extending portion is at an angle to the second outwardly extending portion;
    at least one upstanding retention clip adapted for gripping a side wall portion of the casing which as a gap between adjacent sidewall portions, wherein the clip is positioned on the first or second outwardly extending portions;
    a shielding part located on an outer edge of the connector part for shielding a portion of the casing, the shielding part projecting upwards relative to the surface of the connector part, the shielding part comprising an extension portion at a top end that forms a surface which can be sufficiently interacted with and picked up by a suction instrument, wherein the shielding part projects upwards at an incline relative to the surface of the connector part, such that the shielding part is bent inwards towards the connector part, and the angle of the incline is such that the gap in the casing is substantially covered to reduce EMI entering the casing, or dust or water entering the casing.

18. The clip terminal of claim 17, wherein the shielding part comprises a first shielding wall connected to an outer edge of the first outwardly extending portion of the connector part and a second shielding wall connected to the first shielding wall.

19. The clip terminal of claim 18, wherein the second shielding wall has a planar surface axially aligned with at least a part of an outer edge of the second outwardly extending portion of the connector part.

20. The clip terminal of claim 18, wherein the extension portion is at a top end of the first shielding wall.

21. The clip terminal of claim 18, wherein the second shielding wall has a top end which can be sufficiently gripped and picked up by a gripping instrument.

22. The clip terminal of claim 17 wherein the surface of the extension portion is substantially parallel to the surface of the connector part.

23. The clip terminal of claim 17, wherein the angle is such that the first outwardly extending portion and the second outwardly extending portion form a substantially perpendicular shape corresponding to that of a corner portion of the casing, and the shielding part is configured to shield the corner portion of the casing.

24. The clip terminal of claim 17, wherein there are at least two upstanding retention clips, at least one positioned on the first outwardly extending portion and at least another positioned on the second outwardly extending portion.

25. The clip terminal of claim 17, wherein there is at least a pair of upstanding retention clips positioned on the first or second outwardly extending portions.

26. The clip terminal of claim 25, wherein each of the first outwardly extending portion and the second outwardly extending portion comprise the pair of the upstanding clips.

27. The clip terminal of claim 17, where the retention clip or the pair of upstanding clips is/are integral with the connector part.

28. The clip terminal of claim 17, wherein the shielding part is integral with the connector part.

29. The clip terminal of claim 17, wherein at least the top part of the shielding part is arranged to contact at least part of the casing to be retained by the clip terminal.

30. The clip terminal of claim 17, wherein the at least one upstanding retention clip has a first height relative to a surface of the connector part, and the shielding part has a second height relative to the surface of the connector part, wherein the second height is greater than the first height.

31. A method for retaining a casing relative to a circuit board, comprising:
   providing a circuit board with electrical circuitry;
   providing at least one clip terminal of claim 17 in a position proximal to the electrical circuitry on the circuit board; and
   receiving in the clip terminal a casing to shield the electrical circuitry by positioning the casing so as to abut the clip terminal in order to retain the casing in a position relative to the circuit.

* * * * *